United States Patent
Bringivijayaraghavan et al.

(10) Patent No.: US 9,761,285 B1
(45) Date of Patent: Sep. 12, 2017

(54) SENSE AMPLIFIER AND LATCHING SCHEME

(71) Applicant: GLOBALFOUNDRIES INC., Grand Cayman, KY (US)

(72) Inventors: Venkatraghavan Bringivijayaraghavan, Cheyyar (IN); Ramesh Raghavan, Narsingi (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/054,553

(22) Filed: Feb. 26, 2016

(51) Int. Cl.
*G11C 7/06* (2006.01)
*G11C 7/10* (2006.01)
*G11C 11/419* (2006.01)
*G11C 11/4091* (2006.01)

(52) U.S. Cl.
CPC ............ *G11C 7/065* (2013.01); *G11C 7/1051* (2013.01); *G11C 11/4091* (2013.01); *G11C 11/419* (2013.01)

(58) Field of Classification Search
CPC .................................................. G11C 7/1051
USPC ........................................................ 365/154
See application file for complete search history.

(56) References Cited

U.S. PATENT DOCUMENTS

| | | | | |
|---|---|---|---|---|
| 6,396 A | * | 4/1849 | Andrews ................... | B66D 1/22 254/344 |
| 5,206,544 A | * | 4/1993 | Chen ..................... | H03K 17/163 326/103 |
| 5,241,502 A | * | 8/1993 | Lee ......................... | G11C 5/145 326/88 |
| 5,657,292 A | * | 8/1997 | McClure ................... | G11C 7/00 365/221 |
| 5,684,415 A | * | 11/1997 | McManus ........ | H03K 19/01852 326/27 |
| 6,097,642 A | * | 8/2000 | Takahashi ............ | G11C 7/1048 365/189.05 |
| 6,320,798 B1 | * | 11/2001 | Jo ........................ | G11C 11/4091 365/189.11 |
| 6,320,816 B2 | | 11/2001 | Seyyedy et al. | |
| 6,366,130 B1 | * | 4/2002 | Podlesny ............... | G11C 7/065 326/86 |
| 6,819,144 B2 | * | 11/2004 | Li ........................... | G11C 7/065 327/215 |

(Continued)

OTHER PUBLICATIONS

Hooda et al., "Design and Analysis of a low Power CMOS Sense Amplifier for Memory Application", International Journal of Innovative Technology and Exploring Engineering (IJITEE), ISSN: 2278-3075, vol. 2, Issue-5, Apr. 2013, 9 pages.

*Primary Examiner* — Alexander Sofocleous
*Assistant Examiner* — Mushfique Siddique
(74) *Attorney, Agent, or Firm* — Anthony Canale; Andrew M. Calderon; Roberts Mlotkowski Safran Cole & Calderon, P.C.

(57) ABSTRACT

Approaches for a circuit are provided. The circuit includes a sense amplifier circuit which includes a plurality of transistors enabled by a sense amplifier enable signal to output a first output data line true signal and a second output data line complement signal to a latching circuit, and the latching circuit which includes a primary driver actively driven by the first output data line true signal and a secondary driver actively driven by the second output data line complement signal such that the latching circuit outputs a read global data line.

19 Claims, 2 Drawing Sheets

(56) References Cited

U.S. PATENT DOCUMENTS

| | | | |
|---|---|---|---|
| 7,313,040 B2* | 12/2007 | Huang | G11C 7/062 365/205 |
| 7,317,333 B1* | 1/2008 | Zhou | H03K 19/0013 326/80 |
| 8,536,898 B2* | 9/2013 | Rennie | G11C 7/065 327/51 |
| 8,792,267 B1 | 7/2014 | Chandwani et al. | |
| 9,208,859 B1* | 12/2015 | Bringivijayaraghavan | G11C 11/419 |
| 2005/0253639 A1* | 11/2005 | Chan | G11C 7/1051 327/200 |
| 2005/0276136 A1* | 12/2005 | Gans | G11C 7/065 365/205 |
| 2007/0008004 A1* | 1/2007 | Santurkar | H03K 19/0008 326/82 |
| 2011/0211401 A1* | 9/2011 | Chan | G11C 7/1048 365/189.14 |
| 2013/0076393 A1 | 3/2013 | Stephani et al. | |
| 2013/0148452 A1* | 6/2013 | Schreiber | G11C 7/065 365/203 |
| 2015/0131368 A1* | 5/2015 | Adams | G11C 11/419 365/156 |
| 2015/0380079 A1* | 12/2015 | Agarwal | G11C 7/065 365/156 |

* cited by examiner

… (1)

SENSE AMPLIFIER AND LATCHING SCHEME

FIELD OF THE INVENTION

The present disclosure relates to a sense amplifier and latching scheme and, more particularly, to a sense amplifier and latching scheme that will speed up memory access time.

BACKGROUND

In memory, a sense amplifier is one of the elements which make up the circuitry on a semiconductor memory chip. The sense amplifier is part of a read circuitry that is used when data is read from the memory. The sense amplifier senses low power signals from a bitline that represents a data bit (1 or 0) stored in a memory cell, and amplifies a small voltage swing to recognizable logic levels so that the data can be interpreted properly by logic outside of the memory.

In a static random-access memory (SRAM) operation, in order to read a bit from a particular memory cell a wordline along the particular memory cell's row is turned on, which activates all of the cells in a row. The stored value (0 or 1) from the particular memory cell is then sent to the bitlines associated with the particular memory cell. The sense amplifier at the end of two complimentary bitlines amplifies the small voltages to a normal logic level. The bit from the desired cell is then latched from the particular memory cell's sense amplifier into a buffer, and placed on an output bus.

In a dynamic random-access memory (DRAM) operation, the sense amplifier operation is similar to the SRAM, but performs an additional function. Specifically, the data in DRAM chips is stored as electric charge in tiny capacitors in memory cells. The read operation depletes the charge in a cell, destroying the data, so after the data is read out the sense amplifier must immediately write it back in the cell by applying a voltage to it (i.e., memory refresh).

In a sense amplifier and a latching scheme, only one output of the sense amplifier is used to actively drive a latch. The other output of the sense amplifier stays precharged and remains unutilized (i.e., not used to drive the latch). The latch in the conventional design is generally a SR NOR latch. In this arrangement, the performance is slowed by a large number of complex stacked gates.

In another type of sense amplifier and latching scheme, a stacked inverter latch is used instead of a SR NOR latch. This reduces the number of complex stacked gates, improving performance. However, in this type of design, there is still only one output of the sense amplifier which is used to actively drive the latch; the other output of the sense amplifier stays precharged and remains unutilized (i.e., not used to drive the latch).

SUMMARY

In a first aspect of the present disclosure, a circuit includes a sense amplifier circuit which includes a plurality of transistors enabled by a sense amplifier enable signal to output a first output data line true signal and a second output data line complement signal to a latching circuit, and the latching circuit which includes a primary driver actively driven by the first output data line true signal and a secondary driver actively driven by the second output data line complement signal such that the latching circuit outputs a read global data line.

In another aspect of the disclosure, a circuit includes a sense amplifier circuit which includes a plurality of transistors enabled by a sense amplifier enable signal to output a first output data line true signal and a second output data line complement signal to a latching circuit, and the latching circuit which includes a PMOS pull-up device and a NMOS pull-down device which are actively driven by the first output data line true signal and a NMOS pull-up device and a PMOS pull-down device which are actively driven by the second output data line complement signal such that the latching circuit outputs a read global data line.

In an another aspect of the disclosure, a method includes enabling a sense amplifier circuit to output a first output data line true signal and a second output data line complement signal to a latching circuit, actively driving a primary driver of the latching circuit by the first output data line true signal, actively driving a secondary driver of the latching circuit by the second output data line complement signal, and outputting a read global data line based on the primary driver and the secondary driver being actively driven.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a sense amplifier and latching scheme and, more particularly, to a sense amplifier and latching scheme that will speed up a memory access time. In more specific embodiments, the sense amplifier and latching scheme can be provided as an integrated sense amplifier and a latch. Further, the sense amplifier and latching scheme uses two sense amplifier outputs to actively drive a primary driver and a second driver in order to improve performance.

Advantageously, the sense amplifier and the latching scheme of the present disclosure can provide the following advantages and/or functionality:

(i) allows for both outputs (e.g., DLC and DLT) of the sense amplifier to actively drive the latch;

(ii) provides for an equal load on both outputs of the sense amplifier;

(iii) has latch drivers with a common supply (i.e., latch core, common mode source/drain-gate coupling on DLC/DLT);

(iv) provides faster sense amplifier latching speeds (compared to conventional sense amplifier and latching schemes);

(v) provides faster access time (compared to conventional sense amplifier and latching schemes);

(vi) provides high frequency operation (compared to conventional sense amplifier and latching schemes); and (vii) reduces a circuit size (compared to conventional sense amplifier and latching schemes).

Figure 1:
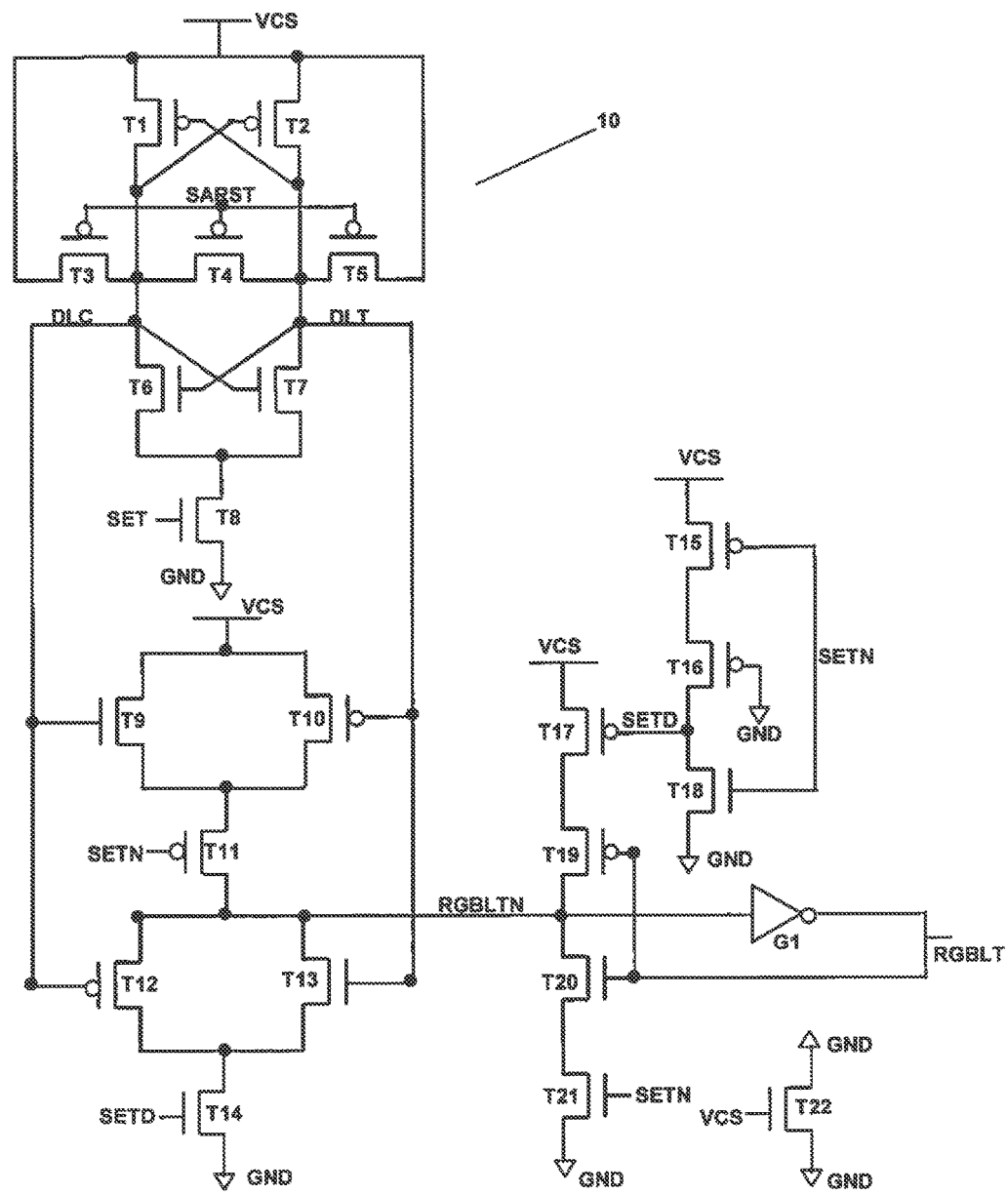
FIG. 1 shows a schematic diagram of a sense amplifier and a latch in accordance with aspects of the present disclosure.

FIG. 1 shows a schematic diagram of a sense amplifier and a latch in accordance with aspects of the present disclosure. In particular, a sense amplifier and a latch 10 includes a gate G1, a plurality of transistors T1-T22, and plurality of signal lines. The signal lines include: a data line true DLT, a data line complement DLC, a sense amp enable SET, a negative sense amp enable SETN, a sense amp enable generation SETD, a read global data line RGBLT, a negative read global data line RGBLTN, a sense amplifier reset signal SARST, a voltage signal VCS, and a ground signal GND. Further, the sense amplifier and the latch 10 of FIG. 1 includes a plurality of PMOS transistors (e.g., T1, T2, T3, T4, T5, T10, T11, T12, T15, T16, T17, and T19) and a plurality of NMOS transistors (e.g., T6, T7, T8, T9, T13, T14, T18, T20, T21, and T22).

As shown in FIG. 1, transistor T1 has a gate connected to a drain of transistor T2, a source connected to the voltage signal VCS, and a drain connected to a gate of transistor T2. The transistor T2 has a source connected to the voltage signal VCS. Transistor T3 has a gate connected to the sense amplifier reset signal SARST, a source connected to the voltage signal VCS, and a drain connected to a source of transistor T4. The transistor T4 has a gate connected to the sense amplifier reset signal SARST and a drain connected to a source of transistor T5. The transistor T5 has a gate connected to the sense amplifier reset signal SARST and a drain connected to the voltage signal VCS.

As further shown in FIG. 1, transistor T6 has a gate connected to a drain of transistor T7, a drain connected to a gate of transistor T7, and a source connected to a drain of transistor T8. The transistor T7 has a source connected to the drain of transistor T8. Transistor T8 has a gate connected to a sense amp enable SET and a source connected to the ground signal GND. Transistor T9 has a gate connected to a drain of transistor T6, a drain connected to the voltage signal VCS, and a source connected to a source of transistor T11. Transistor T10 has a gate connected to a drain of transistor T7, a source connected to the voltage signal VCS, and a drain connected to the source of transistor T11. The transistor T11 has a gate connected to the negative sense amp enable signal SETN and a drain connected to a source of transistor T12. The transistor T12 has a gate connected to a drain of transistor T6 and a drain connected to a drain of transistor T14. Transistor T13 has a gate connected to the drain of transistor T7, a drain connected to the drain of transistor T11, and a source connected to a drain of transistor T14. Transistor T14 has a gate connected to the sense amp enable generation SETD and a source connected to the ground signal GND.

As further shown in FIG. 1, transistor T15 has a source connected to the voltage signal VCS, a gate connected to the negative sense amp enable SETN, and a drain connected to a source of transistor T16. The transistor T16 has a gate connected to the ground signal GND and a drain connected to a gate of transistor T17. The transistor T17 has a source connected to the voltage signal VCS and a drain connected to a source of transistor T19. Transistor T18 has a gate connected to the negative sense amp enable SETN, a drain connected to the drain of transistor T16, and a source connected to the ground signal GND. Transistor T19 has a gate connected to the read global data line RGBLT and a drain connected to a drain of transistor T20. The transistor T20 has a gate connected to the read global data line RGBLT and a source connected to a drain of transistor T21. Transistor T21 has a source connected to the ground signal GND and a gate connected to the negative sense amp enable SETN. Transistor T22 has a gate connected to the voltage signal VCS and a drain and a source connected to the ground signal GND. Lastly, the gate G1 inverts the negative read global data line RGBLTN and outputs the read global data line RGBLT.

Figure 2:
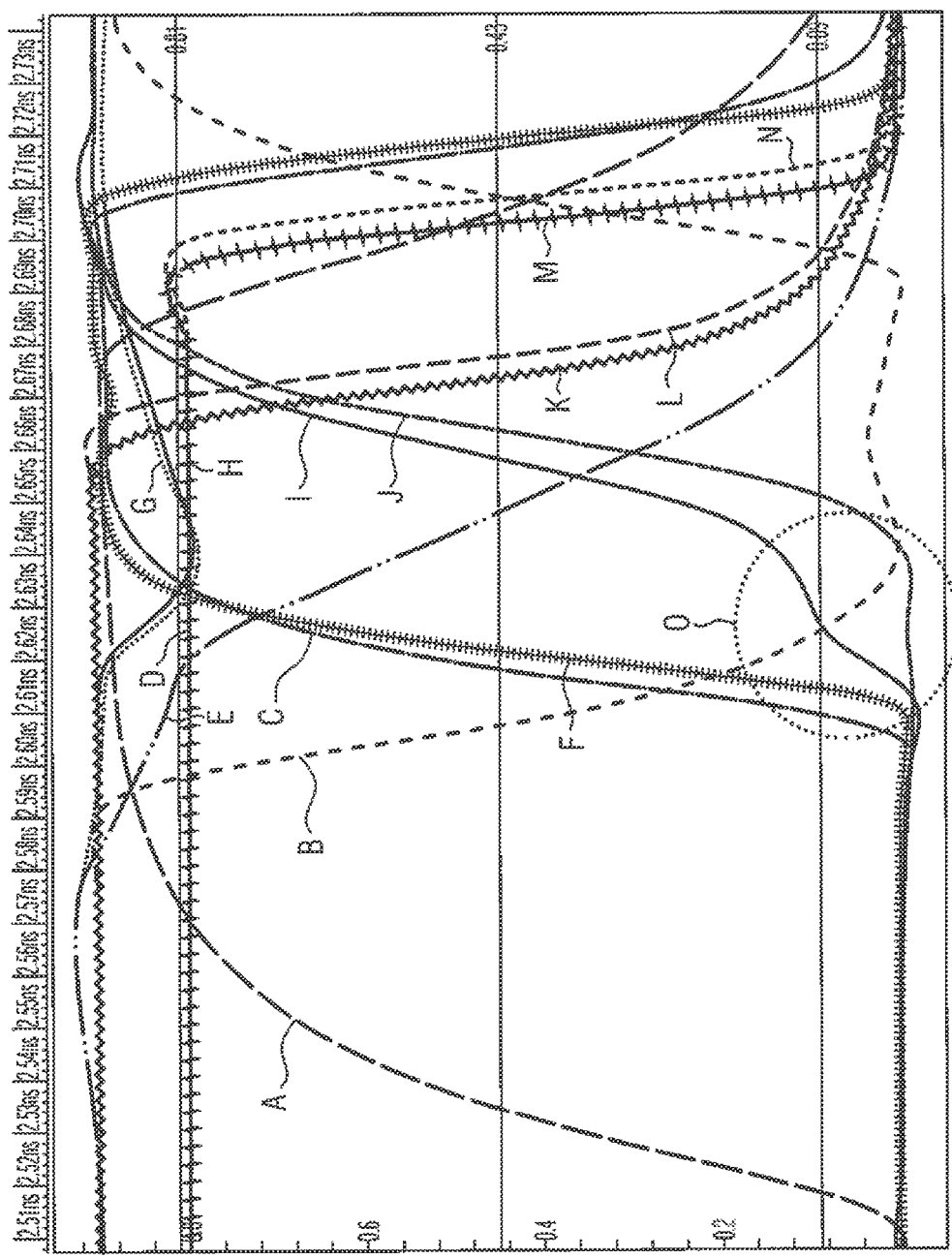
FIG. 2 is a timing diagram of the sense amplifier and the latch in FIG. 1.

In the sense amplifier and the latch 10 of FIG. 1, a primary driver includes the transistors T10 and T13, which share a gate connection to data line true DLT. Further, in the sense amplifier and the latch 10 of FIG. 1, a secondary driver includes the transistors T9 and T12, which share a gate connection to data line complement DLC. Further, as shown in FIG. 2, the primary driver has a PMOS pull-up device (e.g., transistor T10) and a NMOS pull-down device (e.g., transistor T13), and the secondary driver has a NMOS pull-up device (e.g., transistor T9) and a PMOS pull-down device (e.g., transistor T12). As described above, since both the data line true DLT and the data line complement DLC drive the primary driver (e.g., transistors T10 and T13) and secondary driver (e.g., transistors T9 and T12), respectively, sense amplifier latching speeds can be improved up to 8%, access time can be improved, and circuit size can be reduced up to 10%.

As should be understood, the sense amplifier and latch of FIG. 1 may include a latch scheme which includes a primary driver (e.g., transistors T10 and T13) and a secondary driver (e.g., transistors T9 and T12). In the present disclosure, both outputs of the sense amplifier (i.e., data line true DLT and data line complement DLC) are used to actively drive the latch. In other words, the primary driver (e.g., transistors T10 and T13) is driven by data line true DLT and the secondary driver (e.g., transistors T9 and T12) is driven by data line complement DLC. The primary driver may include a PMOS transistor (e.g., transistor T10) and a NMOS transistor (e.g., transistor T13) which share a gate connection to data line true DLT, and the secondary driver may include a NMOS transistor (e.g., transistor T9) and a PMOS transistor (e.g., transistor T12) which share a gate connection to data line complement DLC. In the primary driver, the PMOS transistor (e.g., transistor T10) acts as a pull up device and the NMOS transistor (e.g., transistor T13) acts as a pull down device. For the secondary driver, the NMOS transistor (e.g., transistor T9) acts as a pull up device and the PMOS transistor (e.g., transistor T12) acts as a pull down device.

The read global data line RGBLT in FIG. 1 transitioning from "1" to "0" (i.e., high to low) is a slow path as the data line true DLT sensing is slow. Thus, in the present disclosure, data line complement DLC remains precharged high and drives the latch through the NMOS pull up device (e.g., transistor T9) of the secondary driver at a beginning of the transition (i.e., the previous state of a negative read global data line RGBLTN is a "0", so the NMOS pull up device (e.g., transistor T9) has a VGS=VDS=VCS at sensing).

The read global data line RGBLT in FIG. 1 transitioning from "0" to "1" (i.e., low to high) is a fast path as the data line true DLT remains precharged high and the NMOS pull up device (e.g., transistor T9) of the secondary driver is off (previous state of the negative global data line RGBLT is a "1", so NMOS pull up device (e.g., transistor T9) has a VGS=0 at sensing). Further, the PMOS pull down device (e.g., transistor T12) of the secondary driver speeds up a tail end of the transition.

In view of the above, the present disclosure has an equivalent load on the data line true DLT and data line complement DLC. Further, latch drivers (i.e., primary driver and secondary driver) in the sense amplifier and the latching scheme have a common supply (i.e., at latch core, common mode source/drain-gate coupling on data line true DLT and data line complement DLC outputs).

Also, in comparison to conventional designs of a sense amplifier and a latching scheme, the access time of the scheme shown in FIG. 1 is faster by approximately 5 picoseconds due to both outputs of the sense amplifier being used to drive the latch. Further, in comparison to conventional designs, the architecture of the present disclosure is smaller in size (e.g., approximately 10% smaller in size) due to the reduction in a number of complex gates.

Further, in the sense amplifier and the latch 10 of FIG. 1, a faster access time and a high frequency operation can provide a competitive advantage over conventional designs of a sense amplifier and a latching scheme. Further, the sense amplifier and the latch of FIG. 1 can be used by all types of memory (e.g., 14 nm, 10 nm, etc.), including static random-access memory (SRAM), dynamic random-access memory (DRAM), and also other volatile and non-volatile memories.

FIG. 2 is a timing diagram of the sense amplifier and the latch in FIG. 1. More specifically, the timing diagram of FIG. 2 includes the following elements: (i) a write line WL graph (labeled "A"), (ii) a negative sense amp enable SETN (labeled "B"), (iii) a sense amp enable SET (labeled "C"), (iv) a data line true DLT of a conventional architecture (labeled "D"), (v) a data line true DLT of the present disclosure (labeled "E"), (vi) a sense amp enable generation SETD (labeled "F"), (vii) a data line complementary DLC of a conventional architecture (labeled "G"), (viii) a data line complementary DLC of the present disclosure (labeled "H"), (ix) a negative read global data line RGBLTN of the present disclosure (labeled "I"), (x) a negative read global data line RGBLTN of the conventional architecture (labeled "J"), (xi) a read global data line RGBLT of the present disclosure (labeled "K"), (xii) a read global data line RGBLT of the conventional architecture (labeled "L"), (xiii) an output Q0 of the present disclosure (labeled "M"), (xiv) an output Q0 of the conventional architecture (labeled "N"), and (xv) a portion of the timing diagram which illustrates the effect of a NMOS pull-up device help (labeled "O").

As shown above in FIG. 2, after the sense amp enable SET is transitioned from "0" to "1" (labeled "C"), the read global data line RGBLT (labeled "K") changes a value at a specified timing. In contrast, the read global data line RGBLT of the conventional architecture (labeled "L") changes a value at a timing which is greater than the specified timing. Thus, the timing diagram of FIG. 2 shows that there is a 8% speed up in sense amp latching of the present disclosure in comparison to the conventional architecture.

As further shown in FIG. 2, after the sense amp enable SET is transitioned from "0" to "1" (labeled "C"), the output Q0 (labeled "M") changes a value faster than the output Q0 of the conventional architecture (labeled "N").

In FIG. 2, the effect of the sense amplifier and the latch 10 of FIG. 1 can be seen with reference to the portion of the timing diagram which illustrates the effect of a NMOS pull-up device help (labeled "O"). In the portion labeled "O", the NMOS pull-up device of the secondary driver helps to pull up the read negative global data line RGBLTN of the present disclosure (labeled "I") at a faster time in comparison to the negative read global data line RGBLTN of the conventional architecture (labeled "J").

The methods and structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit, comprising:
    a sense amplifier circuit which comprises a plurality of transistors enabled by a sense amplifier enable signal to output a first output data line true signal and a second output data line complement signal to a latching circuit; and
    the latching circuit which comprises a primary driver actively driven by the first output data line true signal and a secondary driver actively driven by the second output data line complement signal such that the latching circuit outputs a read global data line,
    wherein the secondary driver comprises a NMOS pull-up device and a PMOS pull-down device, and another transistor is directly connected between a source of the NMOS pull-up device and a source of the PMOS pull-down device, and
    a source of the another transistor is directly connected to the source of the NMOS pull-up device, a drain of the another transistor is directly connected to the source of the PMOS pull-down device, and a gate of the another transistor is directly connected to an inverted signal of the sense amplifier enable signal.

2. The circuit of claim 1, wherein the primary driver comprises a PMOS pull-up device and a NMOS pull-down device.

3. The circuit of claim 2, wherein a gate of the PMOS pull-up device and a gate of the NMOS pull-down device are both connected to the first output data line true signal.

4. The circuit of claim 1, wherein a gate of the NMOS pull-up device and a gate of the PMOS pull-down device are both connected to the second output data line complement signal.

5. The circuit of claim 1, wherein a load on the first output data line true signal is equivalent to a load on the second output data line complement signal.

6. The circuit of claim 1, wherein the primary driver and the secondary driver have a common voltage supply.

7. The circuit of claim 1, wherein the plurality of transistors in the sense amplifier circuit comprises five PMOS transistors and three NMOS transistors.

8. The circuit of claim 1, wherein the sense amplifier circuit and the latching circuit comprise a static random access memory (SRAM) device.

9. The circuit of claim 1, wherein the sense amplifier circuit and the latching circuit comprise one of a dynamic random access memory (DRAM) device, another volatile memory device, and a non-volatile memory device.

10. A circuit, comprising:
a sense amplifier circuit which comprises a plurality of transistors enabled by a sense amplifier enable signal to output a first output data line true signal and a second output data line complement signal to a latching circuit;
the latching circuit which comprises a PMOS pull-up device and a NMOS pull-down device which are actively driven by the first output data line true signal and a NMOS pull-up device and a PMOS pull-down device which are actively driven by the second output data line complement signal such that the latching circuit outputs a read global data line; and
another transistor which is directly connected between a source of the NMOS pull-up device and a source of the PMOS pull-down device,
wherein a source of the another transistor is directly connected to the source of the NMOS pull-up device, a drain of the another transistor is directly connected to the source of the PMOS pull-down device, and a gate of the another transistor is directly connected to an inverted signal of the sense amplifier enable signal.

11. The circuit of claim 10, wherein a gate of the PMOS pull-up device and a gate of the NMOS pull-down device are both connected to the first output data line true signal.

12. The circuit of claim 10, wherein a gate of the NMOS pull-up device and a gate of the PMOS pull-down device are both connected to the second output data line complement signal.

13. The circuit of claim 10, wherein a load on the first output data line true signal is equivalent to a load on the second output data line complement signal.

14. The circuit of claim 10, wherein the primary driver and the secondary driver have a common voltage supply.

15. The circuit of claim 10, wherein the plurality of transistors in the sense amplifier circuit comprises five PMOS transistors and three NMOS transistors.

16. A method, comprising:
enabling a sense amplifier circuit to output a first output data line true signal and a second output data line complement signal to a latching circuit;
actively driving a primary driver of the latching circuit by the first output data line true signal;
actively driving a secondary driver of the latching circuit by the second output data line complement signal; and
outputting a read global data line based on the primary driver and the secondary driver being actively driven through another transistor which is connected between a source of a NMOS pull-up device of the secondary driver and a source of a PMOS pull-down device of the secondary driver,
wherein a source of the another transistor is directly connected to the source of the NMOS pull-up device, a drain of the another transistor is directly connected to the source of the PMOS pull-down device, and a gate of the another transistor is directly connected to an inverted signal of a sense amplifier enable signal.

17. The method of claim 16, wherein a load on the first output data line true signal is equivalent to a load on the second output data line complement signal.

18. The method of claim 16, wherein the primary driver and the secondary driver have a common voltage supply.

19. The method of claim 16, wherein the primary driver comprises a PMOS pull-up device and a NMOS pull-down device.

* * * * *